United States Patent [19]

Huang et al.

[11] Patent Number: 5,241,196
[45] Date of Patent: Aug. 31, 1993

[54] PHOTORESPONSIVE DEVICE INCLUDING COMPOSITION GRADING AND RECESSED CONTACTS FOR TRAPPING MINORITY CARRIERS

[75] Inventors: Chao Huang, Agoura Hills; Kenneth Kosai, Goleta; Joan K. Chia, Santa Barbara, all of Calif.

[73] Assignee: Santa Barbara Research Center, Goleta, Calif.

[21] Appl. No.: 777,874

[22] Filed: Oct. 15, 1991

[51] Int. Cl.$^5$ .................... H01L 27/14; H01L 31/00
[52] U.S. Cl. .................... 257/185; 257/188; 257/442; 257/461; 257/466
[58] Field of Search .................... 357/16, 30 B, 30 D, 357/30 E, 30 F, 61, 90, 52, 55, 185, 188, 191, 442, 461, 466

[56] References Cited

U.S. PATENT DOCUMENTS

| | | | |
|---|---|---|---|
| 4,117,504 | 9/1978 | Maslov et al. | 357/30 B |
| 4,411,732 | 10/1983 | Wotherspoon | 357/30 B |
| 4,914,495 | 4/1990 | Norton et al. | 357/16 |
| 4,999,694 | 3/1991 | Austin et al. | 357/30 B |

FOREIGN PATENT DOCUMENTS

| | | | |
|---|---|---|---|
| 2100927 | 1/1983 | Japan | 357/30 B |
| 63-117471 | 5/1988 | Japan | 357/30 B |
| 1-12583 | 1/1989 | Japan | 357/30 B |
| 2-218173 | 8/1990 | Japan | 357/30 B |
| 2-291179 | 11/1990 | Japan | 357/30 B |

OTHER PUBLICATIONS

T. Tung et al., "Liquid-Phase Epitaxy of $Hg_{1-x}Cd_xTe$ from Hg Solution: A Route to Infrared Detector Structures", in Materials for Infrared Detectors and Sources, Mater. Res. Soc. Symp. Proc., vol. 90, pp. 321 ff., 1987.

Primary Examiner—Rolf Hille
Assistant Examiner—Minhloan Tran
Attorney, Agent, or Firm—W. C. Schubert; W. K. Denson-Low

[57] ABSTRACT

A mercury-cadmium-telluride (HgCdTe) photoresponsive layer (14) having the composition $Hg_{1-x}Cd_xTe$ is formed on the substrate (12) such that x increases from the surface (14a) of the photoresponsive layer (14) toward the substrate (12). This causes the bandgap in the photoresponsive layer (14) to increase from the surface (14a) toward the substrate (12), thereby urging minority carriers which are photogenerated in the photoresponsive layer (14) to move toward and be trapped at the surface (14a). Laterally spaced first and second ohmic contacts (16,18) are electrically connected to the photoresponsive layer (14) at a predetermined distance ($z_c$) below the surface (14a) such that the photogenerated minority carriers trapped at the surface (14a) are urged away from the contacts (16,18) by the increasing bandgap. An electrically floating photoresponsive layer (24) of opposite conductivity type may be formed between the substrate (12) and the photoresponsive layer (14) to form a Heterojunction Interface Trap.

8 Claims, 6 Drawing Sheets

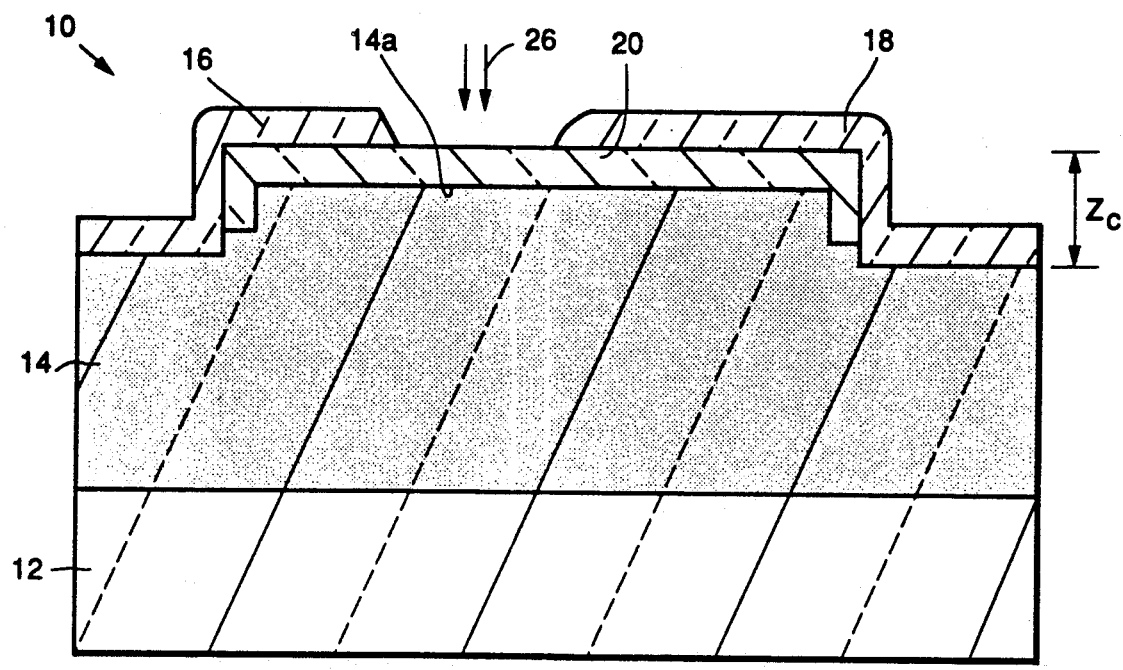
FIG. 1.
FIG. 2.
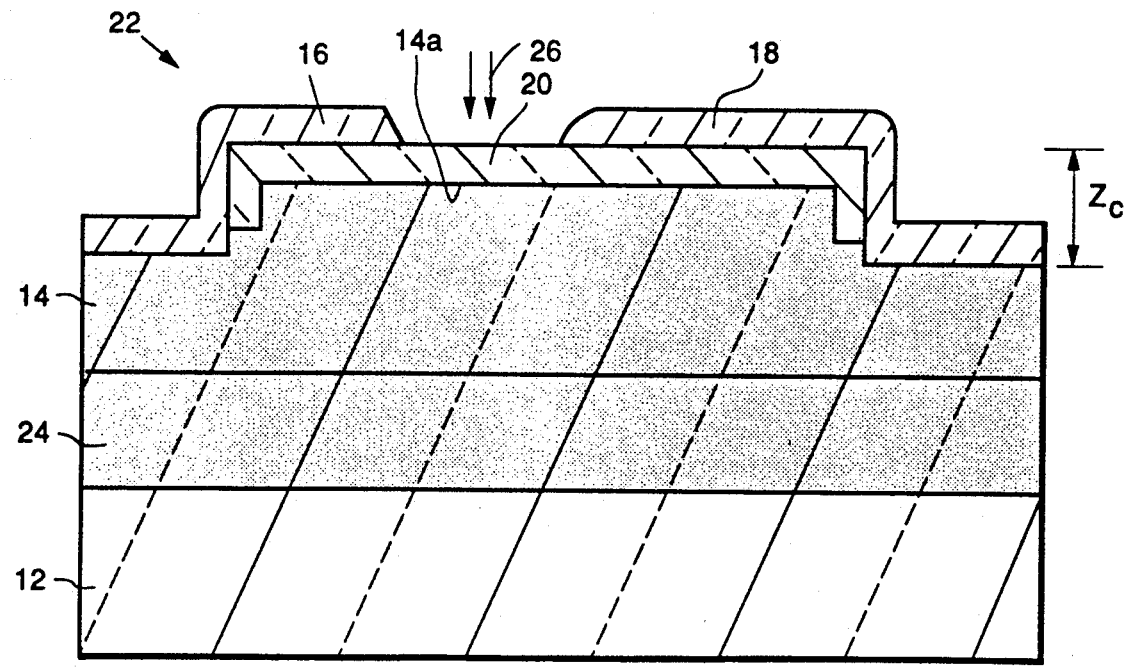

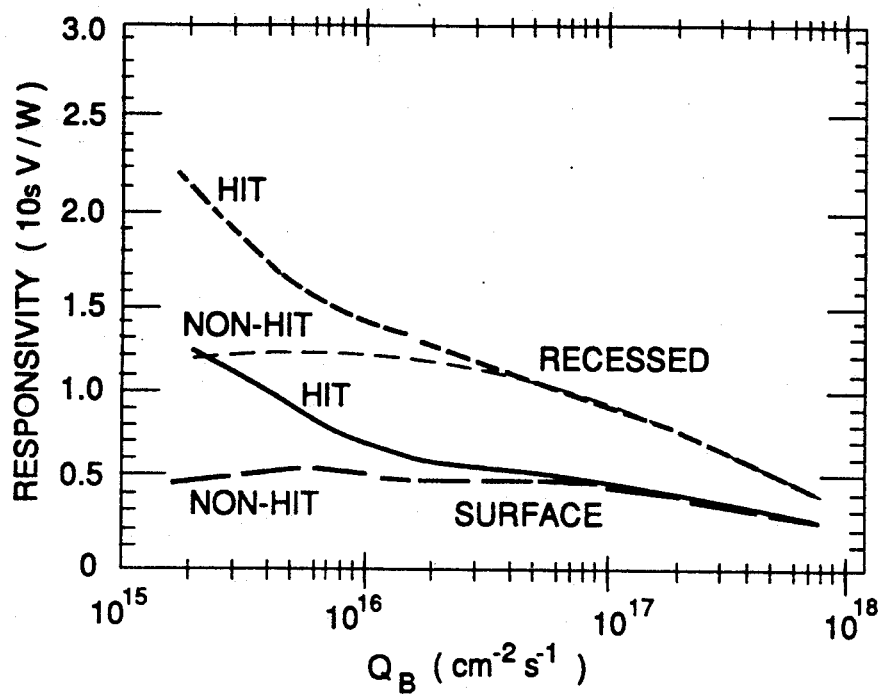
FIG. 5.
FIG. 6.
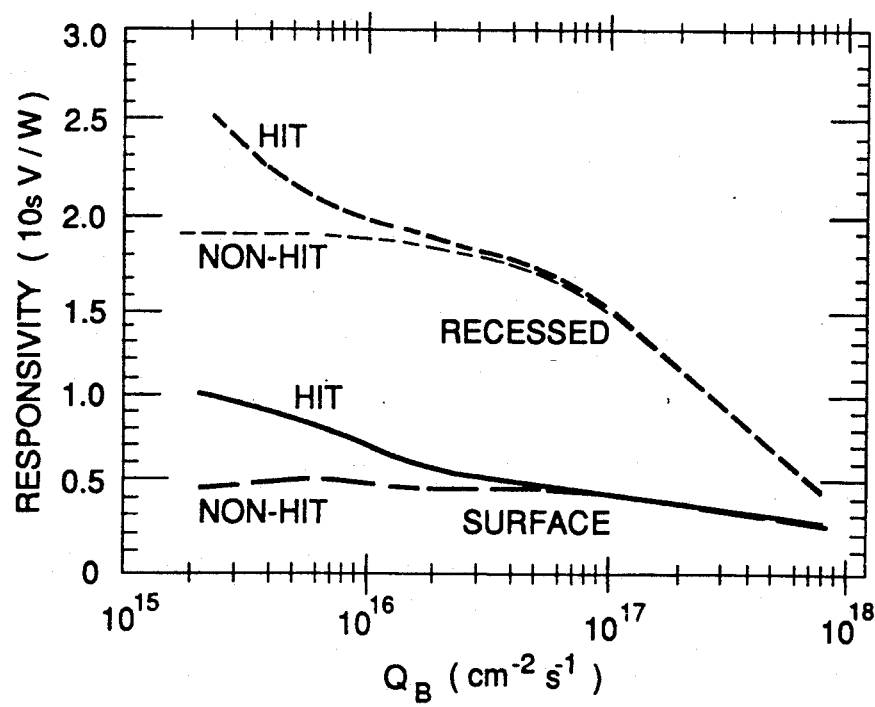

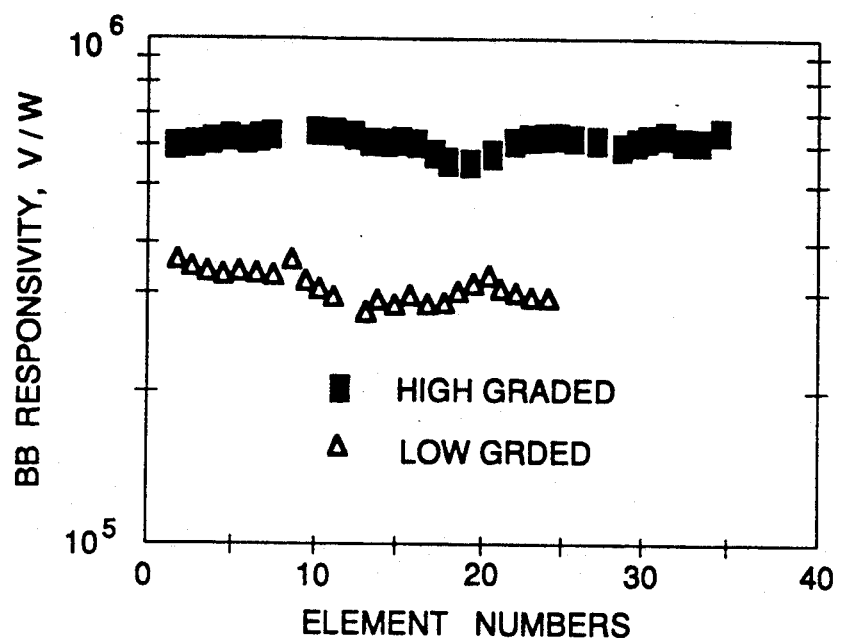
FIG. 10.
FIG. 11.
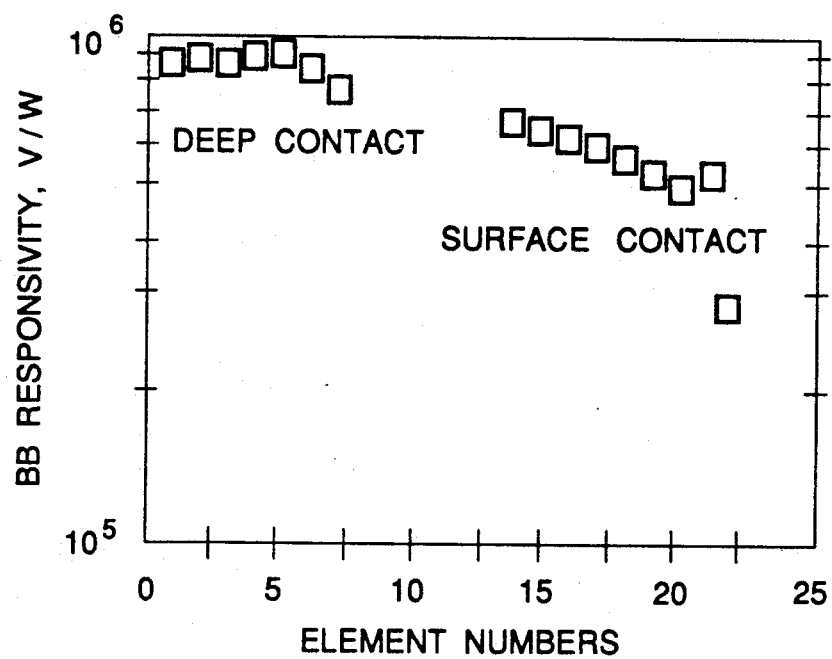

PHOTORESPONSIVE DEVICE INCLUDING COMPOSITION GRADING AND RECESSED CONTACTS FOR TRAPPING MINORITY CARRIERS

GOVERNMENT RIGHTS

This invention was made with Government support under Contract No. F33615-87-C-1446 awarded by the Department of the Air Force. The Government has certain rights in this invention.

BACKGROUND OF THE INVENTION

1. Field of the Invention

The present invention generally relates to the field of optoelectronic image sensing, and more specifically to a photodetector or other photoresponsive device including a graded composition photoresponsive layer and recessed contacts to trap minority carriers at the surface of the photoresponsive layer and increase the excess carrier lifetime and thereby the photoresponsivity of the device.

2. Description of the Related Art

Mercury-cadmium-telluride (HgCdTe) photoconductors are widely used in infrared (IR) imaging systems, especially at wavelengths between 8 and 12 micrometers. HgCdTe is a ternary solid solution having the composition $Hg_{1-x}Cd_xTe$, where x is the mole fraction of cadmium telluride (CdTe). Photodetectors fabricated from this material generally include an n-type photoresponsive layer of HgCdTe formed on a substrate of CdTe or mercury-zinc-telluride (HgZnTe), with laterally spaced electrical contacts attached to the surface of the photoresponsive layer.

The excess minority carrier lifetime is an important characteristic of these devices. Increasing the minority carrier lifetime reduces the carrier recombination rate, thereby increasing the responsivity of the device. U.S. Pat. No. 4,914,495, entitled "PHOTODETECTOR WITH P LAYER COVERED BY N LAYER", issued Apr. 3, 1990 to P. Norton et al discloses a Heterojunction Interface Trap (HIT) photoconductive device fabricated from HgCdTe by liquid-phase epitaxy (LPE). The HIT device includes an n-type IR photoresponsive layer formed on an electrically floating p-type layer located between the n-type layer and a CdTe substrate. The n-type and p-type layers form a heterojunction therebetween.

Minority carrier holes which are photogenerated in the n-type layer diffuse into the p-type layer, and are trapped therein by the potential barrier created by the heterojunction. Minority carrier hole recombination is greatly reduced by the trapping effect, thereby substantially increasing the responsivity of the HIT device compared to a conventional photodetector.

However, a certain amount of recombination does occur in the HIT device at the negative contact, thus limiting the responsivity enhancement of the structure.

SUMMARY OF THE INVENTION

A photoresponsive device embodying the present invention includes a mercury-cadmium-telluride (HgCdTe) photoresponsive layer having the composition $Hg_{1-x}Cd_xTe$ formed on a substrate. The photoresponsive layer has a graded composition such that x increases from the surface toward the substrate. This causes the bandgap in the photoresponsive layer to increase from the surface toward the substrate, thereby urging minority carriers which are photogenerated in the photoresponsive layer to move toward and be trapped at the surface.

Laterally spaced first and second contacts are electrically connected to the photoresponsive layer at a predetermined distance below the surface such that the photogenerated minority carriers trapped at the surface are urged away from the contacts by the increasing bandgap. An electrically floating photoresponsive layer of opposite conductivity type may be formed between the substrate and the photoresponsive layer to form a HIT configuration.

The present invention provides improved trapping of excess minority carriers and thereby increased responsivity over standard HIT and conventional photodetectors by trapping the carriers at a location remote from the contacts, and providing a potential barrier which urges the trapped carriers away from the contacts and back toward the trap.

The photoresponsive device is preferably formed by LPE including the steps of applying a coating of a photoresponsive material onto a substrate at a predetermined temperature at which the material is in liquid form, and reducing the temperature at a rate selected to solidify the coating into a photoresponsive layer having a surface and a bandgap which increases from the surface toward the substrate.

Where the photoresponsive layer has a first conductivity type after completion of these steps, the method further comprises annealing the photoresponsive layer in the presence of a gaseous material which is absorbed by and converts at least an upper portion of the photoresponsive layer to a second conductivity type which is opposite to the first conductivity type.

The primary material for fabricating the present photoresponsive device is HgCdTe. However, the invention may also be advantageously practiced using HgZnTe for the photoresponsive layer. It is further within the scope of the invention to fabricate the present photoresponsive device utilizing any other applicable material system including, for example, materials from groups III-IV, II-VI and IV-VI of the periodic table.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 1 is a simplified sectional view of a photoresponsive embodying the present invention in a convention (non-HIT) configuration;

FIG. 2 is a simplified sectional view of a photoresponsive device embodying the present invention in a HIT configuration;

FIG. 5 is a graph illustrating the calculated blackbody responsivity as a function of incident luminous flux for the device of FIG. 2 with a photoresponsive layer composition grading of 0.003/micrometer;

FIG. 6 is a graph illustrating the calculated blackbody responsivity as a function of incident luminous flux for the device of FIG. 2 with a photoresponsive layer composition grading of 0.009/micrometer;

FIG. 10 is a graph illustrating the measured effect of composition grading on blackbody responsivity in devices of the invention; and FIG. 11 is a graph illustrating the measured effect of contact recessing on blackbody responsivity in devices of the invention.

DETAILED DESCRIPTION OF THE INVENTION

Figure 3:
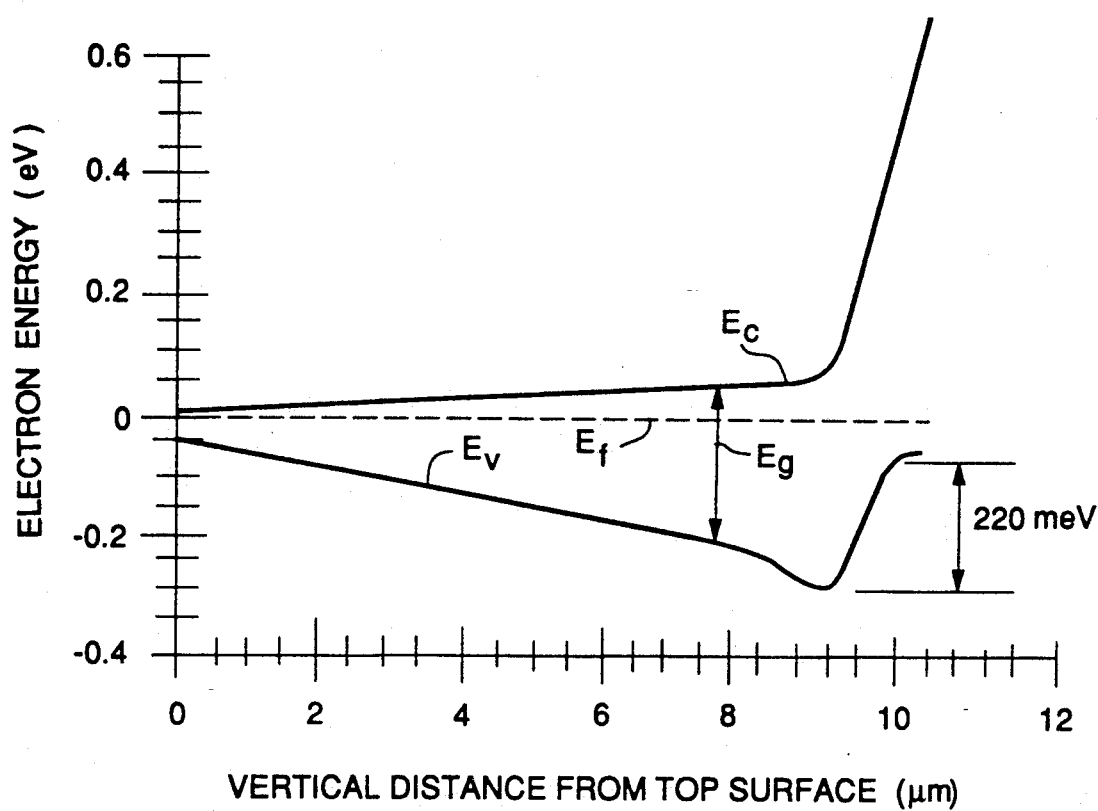
FIG. 3 is a computer simulated energy diagram illustrating the electrical bandgap as a function of distance from the top surface in a photoresponsive layer of the device of FIG. 2.

Referring now to FIG. 1, a photoresponsive device according to the present invention is illustrated as being embodied as a photodetector 10 including a substrate 12 formed of CdTe or CdZnTe. A photoresponsive layer 14 of HgCdTe or HgZnTe is formed on the substrate 12. First and second ohmic contacts 16 and 18 respectively are laterally spaced from each other, and electrically connected to the photoresponsive layer 14. The contacts 16 and 18 are recessed from a top surface 14a of the photoresponsive layer 14 by a distance $z_c$. A conventional passivation and antireflection coating 20 may be formed over the exposed portion of the surface 14a.

The photoresponsive layer 14 preferably has n-type conductivity, such that the majority carriers are electrons and the minority carriers are holes, although the invention is not so limited. FIG. 2 illustrates another photodetector 22 embodying the present invention which is similar to the photodetector 10, except that an electrically floating photoresponsive HgCdTe layer 24 having p-type conductivity is formed between the photoresponsive layer 14 and the substrate 12. The layers 14 and 24 in the photodetector 22 form a heterojunction which constitute a HIT configuration as described above. The photodetector 10 has a non-HIT configuration. The HIT photodetector 22 is the more preferred embodiment of the invention, although the principles of the invention are also advantageously applicable to the non-HIT photodetector 10. The invention will be described in detail below with reference to the embodiment of FIG. 2. It will understood, however, that the structure including the photoresponsive layer 14 and recessed contacts 16 and 18 of FIG. 1 is essentially similar to that of FIG. 2.

In operation, light incident on the photoresponsive layer 14 through a gap between the contacts 16 and 18 as indicated by arrows 26 causes photogeneration of electron-hole pairs which increases the conductivity of the photoresponsive layer 14. The conductivity changes as a known function of the intensity of the incident light 26, which can be sensed across the contacts 16 and 18 in the form of current or voltage.

The main mechanism of photoconduction is by means of the majority carrier electrons. If the excess minority carrier holes were allowed to recombine with electrons at whichever of the contacts 16 or 18 is connected to a negative external source, the responsivity of the photodetector would be low. As described above, some minority carrier holes are swept into and trapped in the p-type layer 24 by the HIT interface structure. In accordance with the present invention, a large number of additional minority carrier holes are urged to the surface 14a of the photoresponsive layer 14 and trapped there, thereby reducing the carrier recombination rate and substantially increasing the responsivity of the photodetector 22.

More specifically, the photoresponsive layer 14 has the composition $Hg_{1-x}Cd_xTe$, where x is the mole fraction of CdTe. In accordance with the present invention, x increases from the surface 14a of the layer 14 toward the substrate 12. This composition grading or increase in x with depth into the photoresponsive layer 14 causes the electrical bandgap $E_g$ in the layer 14 to increase from the surface 14a toward the substrate 12.

As illustrated in the energy band diagram of FIG. 3, the bandgap $E_g$ is the difference in electron energy between the upper edge of the valence band $E_v$ and the lower edge of the conduction band $E_c$ in the layer 14, and is also known in the art as "energy gap" or "forbidden gap". Further illustrated is the Fermi level $E_f$. The increase in bandgap $E_g$ from the surface 14a toward the substrate 12 creates an electrical potential in the layer 14 which increases in the positive direction with depth into the layer 14 and urges minority carriers which are photogenerated in the layer 14, in this case holes, toward the surface 14a.

Figure 4:
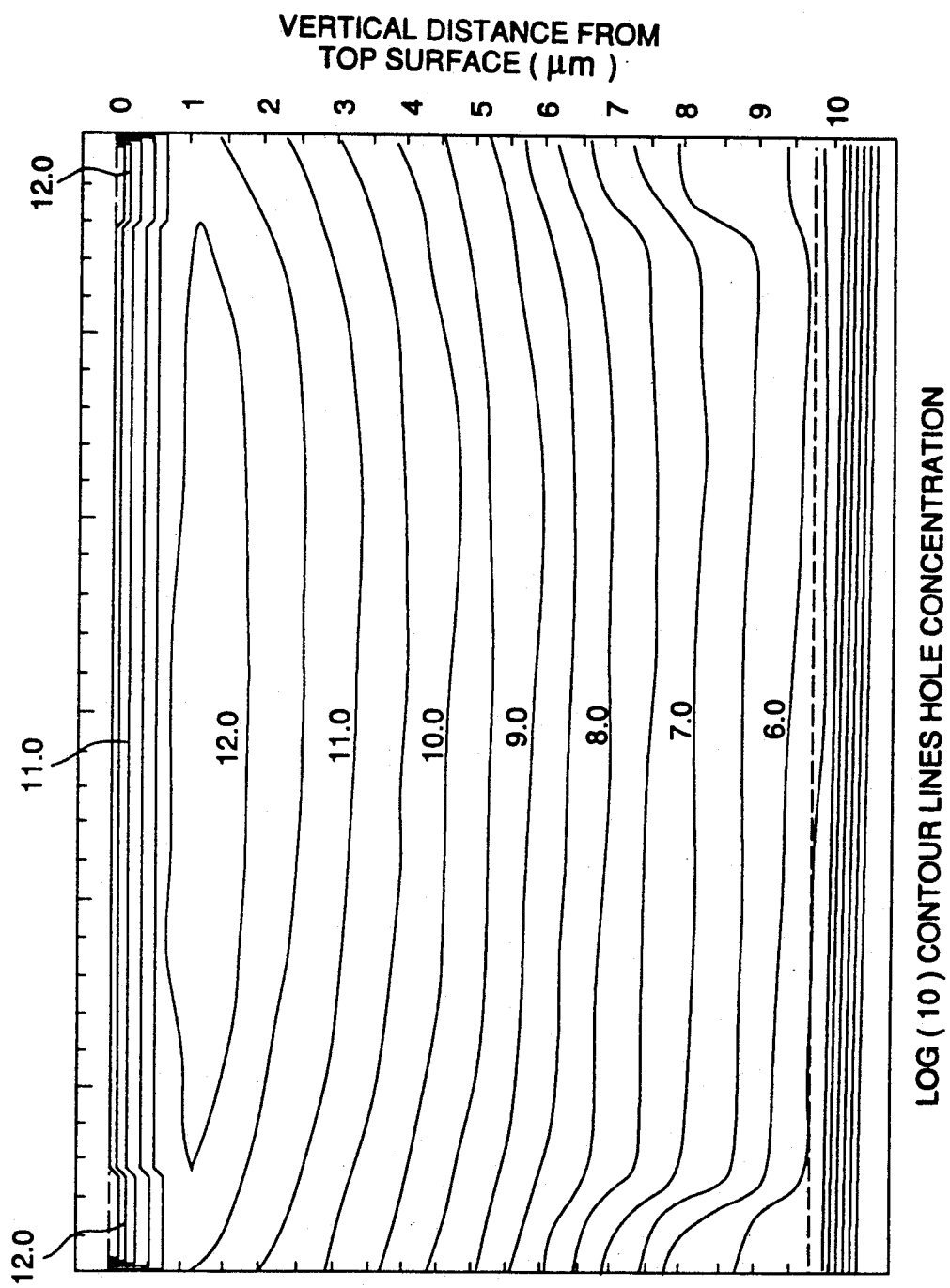
FIG. 4 is a computer simulated graph illustrating the contour lines of constant minority carrier concentration as a function of distance from the surface in the photoresponsive layer of the device of FIG. 2.

FIG. 4 illustrates the $\log_{(10)}$ of the minority carrier concentration as a function of distance from the surface 14a in the layer 14. FIGS. 3 and 4 are computer simulations based on a thickness of the layer 14 of 10 micrometers, composition grading of 0.009/micrometer, temperature of 80° K., and n-type doping concentration of approximately $5 \times 10^{14}$ donors/cm$^3$.

In this example, the bandgap increases on the order of 220 meV from the surface 14a to a distance of approximately 9.5 micrometers below the surface 14a. Whereas the minority carrier concentration has a maximum value on the order of $10^{12}$ holes/cm$^3$ in the region centered around 1.5 micrometers from the surface, the concentration decreases rapidly due to the increasing bandgap and associated electric field provided by the composition gradient to a value of approximately $10^6$ holes/cm$^3$ at a depth of 9.5 micrometers.

The contacts 16 and 18 are recessed so that minority carrier holes in the region between the surface 14a and contacts 16 and 18 are urged toward the surface 14a, and away from the contacts 16 and 18. The greater the depth by which the contacts 16 and 18 are recessed, the greater the concentration of holes that will be trapped above the contacts and prevented from recombining with electrons at the negative contact 16 or 18.

However, the greater the recess depth, the more difficult is subsequent processing, such as maintaining the integrity of passivation 14a and metals 16 across the step. In addition, in the HIT photodetector 22, recess depths must be less than the floating p-type layer 24. In the preferred embodiment of the invention, the composition gradient of x is at least approximately 0.003/micrometer, and the contacts 16 and 18 are recessed by a distance at which the bandgap has increased by approximately 5 kT from the surface 14a into the layer 14, where k is Boltzmann's constant ($8.62 \times 10^{-5}$ eV/K) and T is the temperature of the photoresponsive layer 14 in degrees Kelvin. However, the scope of the invention is not limited to these specific values.

The optimal contact depth based on a bandgap increase of 5 kT for a device embodying the present invention including an $Hg_{1-x}Cd_xTe$ photoresponsive layer in which the surface composition $x_s$ and the average composition grading $s_c$ are specified may be calculated as follows.

The energy gap as a function of $Hg_{1-x}Cd_xTe$ composition and temperature may be expressed, as described in an article entitled "Energy gap versus alloy composition and temperature in $Hg_{1-x}Cd_xTe$", by G. Hansen et al, in the Journal of Applied Physics, Vol. 53, pp. 7099, 1982, as $$E_g(x,t) = -0.301 + 1.93x + 5.35 \times 10^{-4}T(1-2x) - 0.81x^2 + 0.832x^3 \quad \text{equ. (1)}$$

Equ. (1) enables the energy gap at the surface, $E_g(X_s,T)$, to be calculated since both $x_s$ and $T$ are specified.
The energy gap at the contacts may be calculated as $$E_g(x_c,T) = E_g(x_s,T) + 5kT \quad \text{equ. (2)}$$

Using equ. (1), equ. (2) can be numerically solved for $x_c$, the composition of the $Hg_{1-x}Cd_xTe$ layer at the position of the contacts. Assuming that the composition grading is linear with slope $s_c$, the depth z of the contacts is $$z_c = (x_c - x_s)/s_c \quad \text{equ. (3)}$$

As an example, it will be assumed that the $Hg_{1-x}Cd_xTe$ photoresponsive layer has a surface composition $x_s = 0.21$, a composition grading $s_c = 0.003$/micrometer and a device operating temperature of $T = 80°$ K., equ. (1) gives $$E_g(x_s,T) = E_g(0.21,80) = 0.100 \text{ eV}$$

The energy gap at the contacts is thereby $$E_g(x_c,T) = E_g(x_s,T) + 5kT = 0.100 + 5(8.62 \times 10^{-5})80 = 0.135 \text{ eV}$$

Using equ. (1) for $E_g = 0.135$ eV produces $x_c = 0.232$. The contact depth is obtained from equ. (3) as $$z_c = (0.232 - 0.21)/0.003 = 7.33 \text{ micrometers}$$

FIGS. 5 and 6 illustrate the computer simulated blackbody responsivity in $10^5$ V/W as a function of incident flux $Q_B$ in photons/$cm^2$-sec for the non-HIT photodetector 10 and the HIT photodetector 22 for recessed and non-recessed contacts 16 and 18 at a temperature of 80° K. In FIG. 5 the composition grading was 0.003/micrometer, whereas in FIG. 6 the composition grading was 0.009/micrometer. It will be seen that the responsivity is higher for the larger value of grading and recessed contacts 16 and 18. However, at values of $Q_B$ greater than approximately $10^{16}$ photons/$cm^2$-sec, there is little difference between the non-hit photodetector 10 and the HIT photodetector 22.

Figure 7:
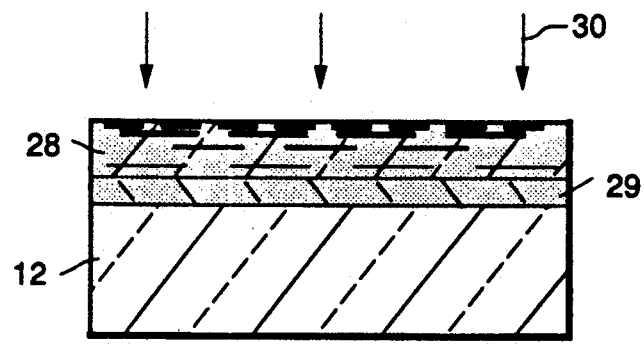
FIGS. 7 and 8 are simplified sectional views illustrating a method of fabrication the photoresponsive device of FIG. 2.
Figure 8:
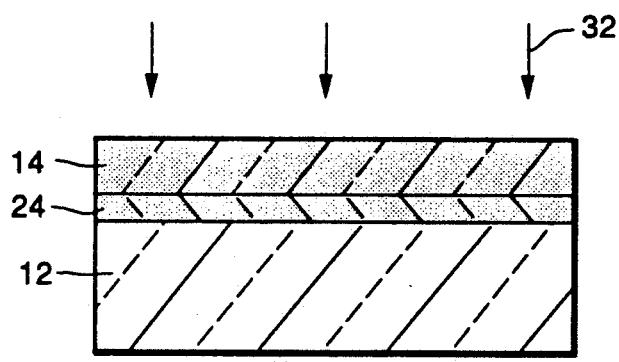

FIGS. 7 and 8 illustrate a method of fabricating the HIT photodetector 22 by LPE in the general manner disclosed in the above referenced patent to Norton. In FIG. 7, a solution 28 in the form of a Hg melt containing predetermined amounts of Te and Cd is held in contact with the substrate 12 at a temperature on the order of 500° C. which is selected to maintain the Te and Cd dissolved in the Hg.

As further indicated by arrows 30 in FIG. 7, the temperature is then reduced at a rate selected such that the HgCdTe in solution 28 will deposit to form a coating as an epitaxial layer 29 having a selected composition grading in excess of 0.003/micrometer. The composition of the solution 28 and the temperature conditions are controlled such that the epitaxial layer 29 contains a substantial number of Hg vacancies in its crystal structure, and thereby has p-type conductivity. The p-type concentration, as grown, is typically in the range of $10^{15}-10^{18}$ acceptors/$cm^3$.

The initial temperature and reduction rate required to achieve the desired grading are complicated functions of numerous variables and are best determined empirically. However, composition grading control per se is known in the art, such as described in an article entitled "LIQUID-PHASE EPITAXY OF $Hg_{1-x}Cd_xTe$ FROM Hg SOLUTION: A ROUTE TO INFRARED DETECTOR STRUCTURES", by T. Tung et al, in Materials for Infrared Detectors and Sources, Mater. Res. Soc. Symp. Proc., Vol. 90, pp. 321 ff.

As illustrated by arrows 32 in FIG. 8, the structure is annealed in the presence of gaseous Hg which is absorbed by the upper portion of the epitaxial layer 29 as solidified from the solution 28. The annealing step is performed at a temperature on the order of 200° C.-300° C. for a length of time selected to anneal and convert the layer to the desired depth. The Hg atoms in the gas fill the Hg vacancies in the crystal structure of the epitaxial layer, thereby converting the upper portion thereof to n-type conductivity. As the result of the annealing step of FIG. 8, the lower or unconverted portion of the epitaxial layer constitutes the p-type trapping layer 24, whereas the upper or converted portion constitutes the n-type photoresponsive layer 14. The n-type concentration in the layer 14 is approximately $10^{15}$ donors/$cm^3$.

After completion of the structure illustrated in FIG. 8, the layer 14 is processed using chemical etching, plasma etching, ion beam etching or the like to define the photodetector 22 on the substrate 12, form recesses for the contacts 16, and deposit the passivation and antireflection coating 20 and contacts 16 and 18 to produce the complete photodetector 22 illustrated in FIG. 2. The methods for performing these steps are known in the art per se, and the details thereof are not the subject matter of the present invention.

Figure 9:
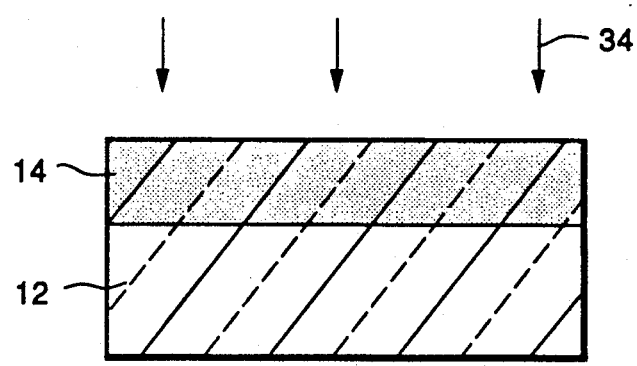
FIG. 9 is a simplified sectional view illustrating a method of fabricating the photoresponsive device of FIG. 1.

FIG. 9 illustrates the fabrication of the non-HIT structure 10. The step of FIG. 7 is first performed in the manner described above with reference to the HIT structure 22. Then, the epitaxial layer 29 solidified from the solution 28 is annealed as indicated by arrows 34. The annealing in this case is performed under conditions such that substantially the entire thickness of the epitaxial layer 29 is annealed to convert it to n-type conductivity and thereby produce the layer 14. The layer 14 is then processed to define the photodetector 10 on the substrate 12, form recesses for the contacts 16, and deposit the passivation and antireflection coating 20 and contacts 16 and 18 to produce the complete photodetector 10 illustrated in FIG. 1.

EXAMPLE

Long-wave infrared (LWIR) photodetector device arrays were fabricated on one low-graded LPE photoresponsive layer having a grading of 0.003/micrometers, and one high-graded layer having a grading of 0.009/micrometer. The high-graded wafer was further processed to include devices with surface contacts and devices with recessed contacts. The arrays were subjected to radiometric testing to determine the effects of composition grading and contact depth on the device performance.

As illustrated in FIG. 10, the high-graded array achieved approximately 1.7 times higher blackbody responsivity than the low-graded array. The horizontal axis indicates the element number, or the position in the array of the particular photodetector device under test. Both of the arrays illustrated in FIG. 10 had recessed contacts. The data was taken at 80° K. and a background photon flux of $1.7 \times 10^{16}$ photons/cm$^2$-sec.

As illustrated in FIG. 11, a high-graded (0.009/micrometer) wafer was processed with surface contacts on one-half of the wafer and recessed contacts on the other half. Data was taken under the same conditions as for FIG. 10. The blackbody responsivity of the devices with recessed contacts was approximately 1.5 times higher than that of the devices with surface contacts.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A photoresponsive device comprising:
a substrate; and
a first photoresponsive layer formed on said substrate, said first photoresponsive layer having first and second opposing surfaces with said first surface further from said substrate than said second surface and having a bandgap which increases from said first surface toward the substrate and urges minority carriers which are photogenerated in said photoresponsive layer toward said first surface, said first photoresponsive layer having a first conductivity type; and
a second photoresponsive layer formed between said substrate and said first photoresponsive layer, said second photoresponsive layer having a conductivity type which is opposite to said first conductivity type.

2. A device as in claim 1, in which:
said first photoresponsive layer has the composition $A_{1-x}B_xC$, where A, B and C are first, second and third materials respectively; and
x increases from said first surface toward said substrate, thereby creating said increasing bandgap.

3. A device as in claim 2, in which the first material A is mercury, the second material B is cadmium and the third material C is tellurium.

4. A device as in claim 3, in which x increases at a rate of at least approximately 0.003/micrometer.

5. A device as in claim 3, in which said substrate comprises cadmium-zinc-telluride.

6. A device as in claim 2, in which the first material A is mercury, the second material B is zinc and the third material C is tellurium.

7. A device as in claim 1, further comprising first and second contacts which are laterally spaced from each other and electrically contact the first photoresponsive layer at a predetermined distance below said first surface such that said photogenerated minority carriers between said first surface and the first and second contacts are urged away from the first and second contacts toward said first surface by said increasing bandgap.

8. A device as in claim 7, in which said predetermined distance is selected such that said bandgap increases over said predetermined distance by approximately 5 kT, where k is Boltzmann's constant and T is the absolute temperature of said first photoresponsive layer.

* * * * *